US012561021B2

(12) United States Patent
Kadowaki et al.

(10) Patent No.: US 12,561,021 B2
(45) Date of Patent: *Feb. 24, 2026

(54) EXTENSION WIRES AND CONNECTION WIRES FOR POSITION DETECTION DEVICE AND SENSOR PANEL

(71) Applicant: Wacom Co., Ltd., Saitama (JP)

(72) Inventors: Jun Kadowaki, Saitama (JP); Ryutaro Nitobe, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/946,773

(22) Filed: Nov. 13, 2024

(65) Prior Publication Data

US 2025/0068278 A1 Feb. 27, 2025

Related U.S. Application Data

(63) Continuation of application No. 18/352,129, filed on Jul. 13, 2023, now Pat. No. 12,169,605, which is a
(Continued)

(30) Foreign Application Priority Data

Aug. 27, 2021 (JP) ................................. 2021-138642

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0418* (2013.01); *G06F 3/0441* (2019.05);
(Continued)

(58) Field of Classification Search
CPC .. G06F 3/04164; G06F 3/0418; G06F 3/0441; G06F 3/0442; G06F 3/0446;
(Continued)

(56) References Cited

U.S. PATENT DOCUMENTS

| | | | |
|---|---|---|---|
| 8,704,796 B2 | 4/2014 | Nishitani et al. | |
| 10,725,600 B2 | 7/2020 | Saai et al. | |

(Continued)

FOREIGN PATENT DOCUMENTS

| | | |
|---|---|---|
| JP | 2011227793 A | 11/2011 |
| JP | 2014170334 A | 9/2014 |

(Continued)

OTHER PUBLICATIONS

Notice of Reasons for Refusal, mailed Aug. 15, 2023, for corresponding Japanese Application No. 2022-145120. (8 pages) (with English translation).

(Continued)

*Primary Examiner* — Jonathan A Boyd
(74) *Attorney, Agent, or Firm* — Seed Intellectual Property Law Group LLP

(57) ABSTRACT

A position detection device includes first and second sensor electrodes that are adjacent to each other, connection wires connected to the respective sensor electrodes and including first and second connection wires connected to the first and second sensor electrodes, respectively, a sensor controller connected to the connection wires, and a first extension line; and a second extension line. Some of the plurality of connection wires, including the first connection wire, extend at regular intervals in a first region. The connection wires, including the second connection wire, are arranged to extend at regular intervals in a second region different from the first region. The first extension line extends along the second connection wire in the second region and is electrically
(Continued)

connected to the first sensor electrode. The second extension line extends along the first connection wire in the first region and is electrically connected to the second sensor electrode.

12 Claims, 11 Drawing Sheets

Related U.S. Application Data continuation of application No. 17/847,081, filed on Jun. 22, 2022, now Pat. No. 11,775,105.

(51) Int. Cl.
| | |
|---|---|
| *G01D 5/24* | (2006.01) |
| *H10D 86/40* | (2025.01) |
| *H10D 86/60* | (2025.01) |

(52) U.S. Cl.
CPC .......... *G06F 3/0442* (2019.05); *G06F 3/0446* (2019.05); *G01D 5/24* (2013.01); *G06F 3/04162* (2019.05); *H10D 86/441* (2025.01); *H10D 86/60* (2025.01)

(58) Field of Classification Search
CPC .... G06F 3/04162; G01D 5/24; H10D 86/441; H10D 86/60
See application file for complete search history.

(56) References Cited

U.S. PATENT DOCUMENTS

| | | | |
|---|---|---|---|
| 10,782,836 | B2 | 9/2020 | Kadowaki |
| 11,775,105 | B2 * | 10/2023 | Kadowaki ............. G06F 3/0441 |
| | | | 345/175 |
| 12,169,605 | B2 * | 12/2024 | Kadowaki ............. G06F 3/0442 |
| 2017/0031514 | A1 | 2/2017 | Kimura et al. |
| 2017/0097529 | A1 | 4/2017 | Kubota et al. |
| 2017/0177120 | A1 | 6/2017 | Kyutoku et al. |
| 2018/0239476 | A1 | 8/2018 | Yoshida et al. |
| 2019/0212836 | A1 | 7/2019 | Kadowaki |
| 2020/0089343 | A1 | 3/2020 | Kadowaki et al. |
| 2020/0104027 | A1 | 4/2020 | Gourevitch et al. |
| 2020/0201509 | A1 | 6/2020 | Kadowaki |
| 2020/0241698 | A1 * | 7/2020 | Kadowaki ........... G06F 3/03545 |
| 2022/0147166 | A1 | 5/2022 | Kadowaki et al. |

FOREIGN PATENT DOCUMENTS

| | | |
|---|---|---|
| JP | 2015026343 A | 2/2015 |
| JP | 2020119356 A | 8/2020 |
| WO | WO 2019026649 A1 | 2/2019 |

OTHER PUBLICATIONS

Office Action, issued Apr. 12, 2022, for Japanese Patent Application No. 2021-138642. (6 pages) (with machine-generated English Translation).

* cited by examiner

F I G . 9

DM1 — $N_{DM1}$ — $-$

CLy4 — $S_{30y4}+N_{30y4}+N_{CLy4}$ — $+$

D2

DM2 — $N_{DM2}$ — $-$

CLy5 — $S_{30y5}+N_{30y5}+N_{CLy5}$ — $+$ $S_{30y5} {\sim} S_{30y4}$

F I G . 1 1
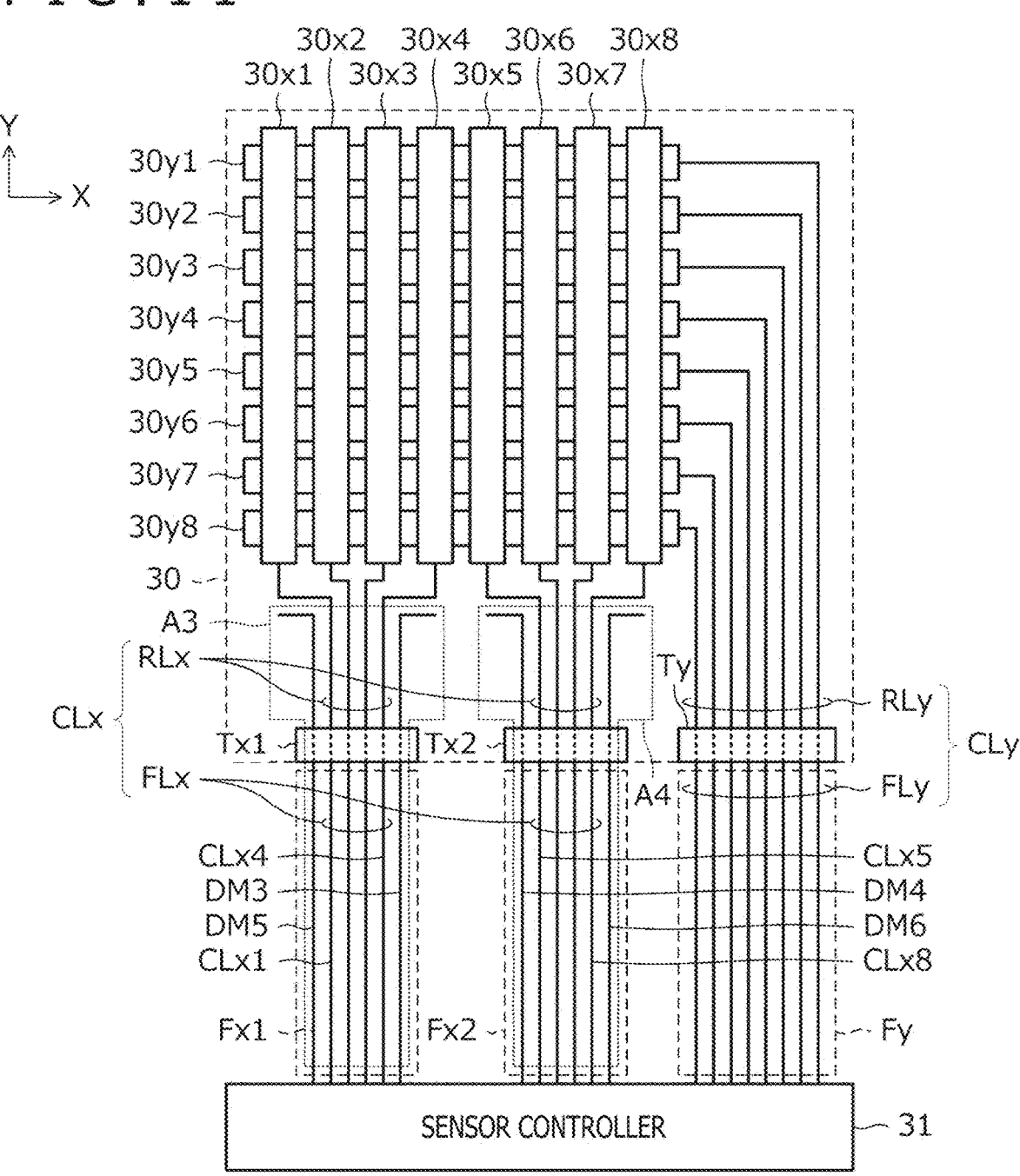

F I G . 1 2 A
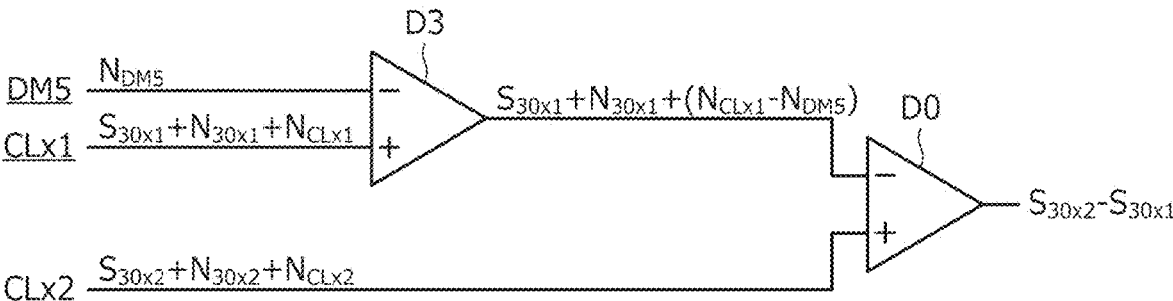
F I G . 1 2 B
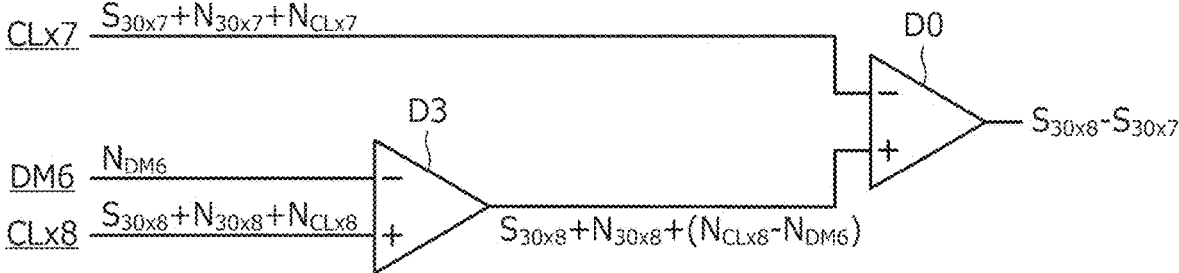

EXTENSION WIRES AND CONNECTION WIRES FOR POSITION DETECTION DEVICE AND SENSOR PANEL

BACKGROUND

Technical Field

The present disclosure relates to a position detection device and a sensor panel.

Background Art

A capacitive position detection device is a device including a sensor panel disposed so as to overlap with a touch surface (which serves also as a display screen of a display), a sensor controller, and a flexible printed circuit board having wires for connecting the sensor controller to the sensor panel. The sensor panel has arranged therein a plurality of X electrodes each arranged to extend in a Y direction and arranged at regular intervals in an X direction, and a plurality of Y electrodes each arranged to extend in the X direction and arranged at regular intervals in the Y direction. Hereinafter, the X electrodes and the Y electrodes will sometimes be referred to collectively as "sensor electrodes."

The sensor panel further has arranged therein a plurality of FPC connection terminals crimped to the wires (hereinafter referred to as "FPC wires") in the flexible printed circuit board, and a plurality of routing lines for connecting each of the plurality of sensor electrodes to a corresponding one of the FPC connection terminals. Hereinafter, the FPC wires and the routing lines will be referred to collectively as "connection wires."

Japanese Patent Laid-open No. 2020-119356 describes a position detection device having the above-described configuration.

Here, the sensor controller is configured to acquire a reception intensity of a signal (hereinafter referred to as a "downlink signal") transmitted by a pen at each of the sensor electrodes and thereby derive a distribution curve of reception intensity, and derive the position of the pen by deriving a vertex of the distribution curve. It is desirable that the reception intensity of the downlink signal can be acquired independently with respect to each of the sensor electrodes in such a process of deriving the position, but in reality, perfect electrical independence of each sensor electrode is impossible because coupling capacitance occurs between adjacent ones of the sensor electrodes and between adjacent ones of the connection wires. Accordingly, the connection wires for the sensor electrodes are often arranged to run side by side at regular intervals to cause the distribution of coupling capacitance with each sensor electrode as a center to be substantially equal. This makes it possible to minimize an effect of the above-described coupling capacitance on the position derivation.

However, in recent years, there have been cases where some or all of the connection wires need to be arranged in a plurality of regions in a distributed manner. Examples of such cases include a case where, due to recent reductions in bezel width of displays, the plurality of routing lines connected to the plurality of Y electrodes need to be arranged to extend over a right region and a left region of the touch surface in a distributed manner. Moreover, recent increases in screen size have caused increases in the number of sensor electrodes, and this has caused a case where the plurality of FPC wires corresponding to the plurality of X electrodes need to be arranged in two or more flexible printed circuit boards in a distributed manner. In such cases, the distribution of coupling capacitance with each of two sensor electrodes corresponding to a region boundary as a center will significantly differ from the distribution of coupling capacitance with any other sensor electrode as a center, and this will result in reduced accuracy of the position derived, and a need for an improvement.

In addition, an external noise is sometimes superimposed upon the downlink signal. Thus, a known sensor controller is configured to derive differentials between reception intensities at adjacent sensor electrodes instead of the reception intensity at each sensor electrode, and derive the above-described distribution curve on the basis of the derived differentials. Such a method of deriving the distribution curve will hereinafter be referred to as a differential method. The differential method causes external noises to be canceled out when the differentials are derived, and thus can minimize an effect caused by the external noises.

Here, in order to minimize the effect caused by the external noises by employing the differential method, the magnitude of the external noise superimposed upon the downlink signal needs to be equal with respect to each of adjacent sensor electrodes. However, in the case where some or all of the connection wires are arranged in a plurality of regions in a distributed manner as described above, the above necessary condition may not be satisfied. That is, the external noise superimposed upon the downlink signal includes components received at the connection wires, and in the case where some or all of the connection wires are arranged in a plurality of regions in a distributed manner as described above, the connection wires connected to two sensor electrodes adjacent to each other may be arranged to extend in regions away from each other. This may cause the magnitude of an external noise received at each of these connection wires not to be equal, and this in turn may cause reduced accuracy of the position derived, and a need for an improvement.

BRIEF SUMMARY

Accordingly, an object of the present disclosure is to provide a position detection device and a sensor panel which are able to minimize a reduction in accuracy in deriving a position which is caused by arranging some or all of connection wires to extend in a plurality of regions in a distributed manner.

A position detection device according to a first aspect of the present disclosure is a position detection device including a plurality of sensor electrodes including a first sensor electrode and a second sensor electrode that are adjacent to each other, a plurality of connection wires each of which is connected to a corresponding one of the plurality of sensor electrodes and which includes a first connection wire connected to the first sensor electrode and a second connection wire connected to the second sensor electrode, a sensor controller connected to the plurality of connection wires, a first extension line and a second extension line. Some of the plurality of connection wires, including the first connection wire, are arranged to extend at regular intervals in a first region. The plurality of connection wires other than the some of the plurality of connection wires, including the second connection wire, extend at regular intervals in a second region different from the first region. The first extension line extends along the second connection wire in the second region and is electrically connected to the first sensor electrode, and the second extension line extends along the first connection wire in the first region and is electrically connected to the second sensor electrode.

A sensor panel according to the first aspect of the present disclosure is a sensor panel including a plurality of sensor electrodes including a first sensor electrode and a second sensor electrode that are adjacent to each other, a plurality of routing lines each of which is connected to a corresponding one of the plurality of sensor electrodes and which includes a first routing line connected to the first sensor electrode and a second routing line connected to the second sensor electrode, a first extension line and a second extension line. Some of the plurality of routing lines, including the first routing line, extend at regular intervals in a first region. The plurality of routing lines other than the some of the plurality of routing lines, including the second routing line, extend at regular intervals in a second region different from the first region. The first extension line extends along the second routing line in the second region and is electrically connected to the first sensor electrode, and the second extension line extends along the first routing line in the first region and is electrically connected to the second sensor electrode.

A position detection device according to a second aspect of the present disclosure is a position detection device including a plurality of sensor electrodes including a first sensor electrode and a second sensor electrode that are adjacent to each other, a plurality of connection wires each of which is connected to a corresponding one of the plurality of sensor electrodes and which includes a first connection wire connected to the first sensor electrode and a second connection wire connected to the second sensor electrode, a sensor controller connected to the plurality of connection wires, and first and second dummy lines. Some of the plurality of connection wires, including the first connection wire, extend at regular intervals in a first region. The plurality of connection wires other than the some of the plurality of connection wires, including the second connection wire, extend at regular intervals in a second region different from the first region. The first dummy line extends along the first connection wire in the first region and is connected to the sensor controller without being connected to any of the plurality of sensor electrodes, and the second dummy line extends along the second connection wire in the second region and is connected to the sensor controller without being connected to any of the plurality of sensor electrodes. The sensor controller, in operation, derives a position of a pen based on a differential between a first differential signal obtained by subtracting a signal supplied from the first dummy line from a signal supplied from the first connection wire and a second differential signal obtained by subtracting a signal supplied from the second dummy line from a signal supplied from the second connection wire.

According to the first aspect of the present disclosure, it is possible to cause the distribution of coupling capacitance with each of the sensor electrodes as a center to fall within a substantially fixed range, making it possible to minimize a reduction in accuracy in deriving a position which is caused by arranging some or all of the connection wires to extend in a plurality of regions in a distributed manner.

According to the second aspect of the present disclosure, external noises can be canceled out when the differential is derived, and this makes it possible to minimize a reduction in accuracy in deriving a position which is caused by arranging some or all of the connection wires to extend in a plurality of regions in a distributed manner.

BRIEF DESCRIPTION OF THE DRAWINGS

FIGS. 3A, 3B, and 3C are each a diagram schematically illustrating the distribution of coupling capacitance with one of Y electrodes as a center in a comparative example in which extension lines are eliminated from a sensor panel illustrated in FIG. 2, while FIGS. 3D, 3E, and 3F are each a diagram schematically illustrating the distribution of coupling capacitance with one of Y electrodes as a center according to the first embodiment of the present disclosure;

FIG. 9 is a diagram illustrating a circuit provided in a sensor controller according to a first modification of the second embodiment of the present disclosure;

FIG. 11 is a diagram illustrating the configuration of a position detection device according to a third modification of the second embodiment of the present disclosure in detail; and FIGS. 12A and 12B are each a diagram illustrating a circuit provided in a sensor controller according to a third modification of the second embodiment of the present disclosure.

DETAILED DESCRIPTION

Hereinafter, embodiments of the present disclosure will be described in detail with reference to the accompanying drawings.

Figure 1:
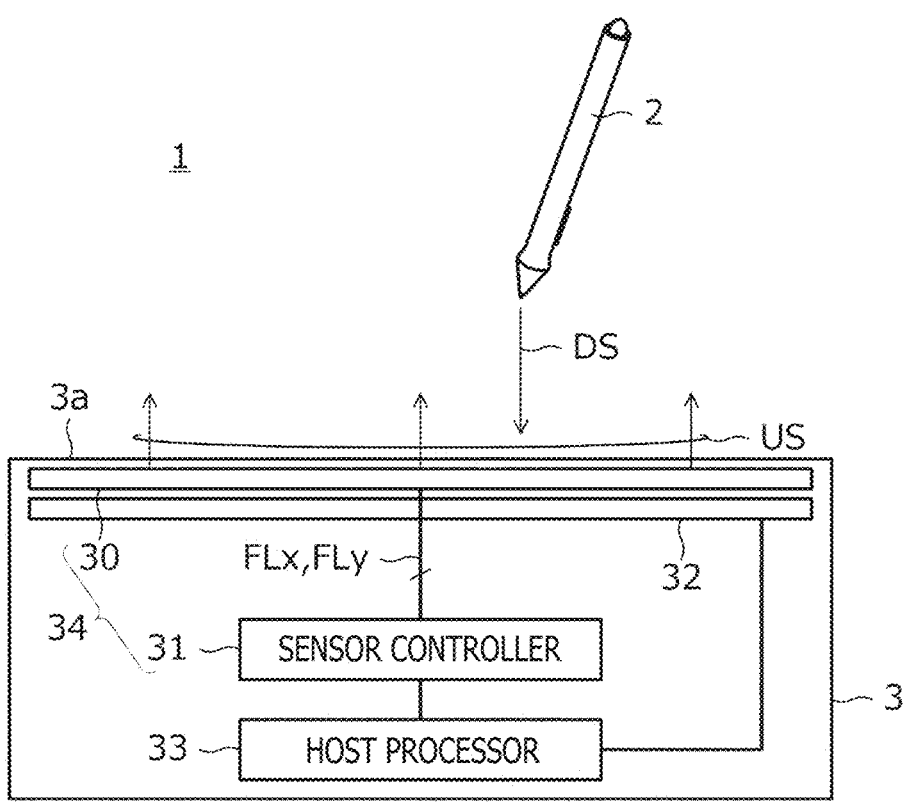
FIG. 1 is a diagram illustrating the system configuration of a position detection system 1 according to a first embodiment of the present disclosure.

FIG. 1 is a diagram illustrating the system configuration of a position detection system 1 according to a first embodiment of the present disclosure. As illustrated in this figure, the position detection system 1 includes a pen 2 and an electronic device 3 including a touch surface 3a. The pen 2 is an active pen supporting an active capacitive coupling method. The electronic device 3 is, for example, a tablet-type computer and includes a sensor panel 30, a sensor controller 31, a display 32, and a host processor 33 as illustrated in the figure.

The pen 2 is configured to receive an uplink signal US transmitted from the sensor controller 31 through the sensor panel 30 and transmit a downlink signal DS in response to the received uplink signal US. The uplink signal US is a signal transmitted by the sensor controller 31 periodically and has functions of notifying the pen 2 of transmission timing of the downlink signal DS and reception timing of a next uplink signal US and transmitting a command to the pen 2. Receiving the uplink signal US, the pen 2 determines a transmission and reception schedule of the downlink signal DS and the next uplink signal US on the basis of reception timing of the uplink signal US, and transmits the downlink signal DS and receives the next uplink signal US according to the determined transmission and reception schedule. In addition, the pen 2 generates the downlink signal DS according to a command included in the uplink signal US.

The downlink signal DS is a signal including a position signal, which is an unmodulated carrier signal, and a data signal, which is a carrier signal modulated on the basis of data. The position signal is used for the sensor controller 31 to derive the position of the pen 2. Meanwhile, the data signal is used to transmit given data from the pen 2 to the sensor controller 31. Examples of the data transmitted by the data signal include a pen identifier (ID) assigned to the pen 2 in advance, a pen pressure value indicating the magnitude of pressure applied to a pen tip of the pen 2, and information indicating the ON/OFF state of a switch provided on an external surface of the pen 2.

The sensor panel 30 and the sensor controller 31 together form a position detection device 34 that detects the position of the pen 2 in the touch surface 3a. Specifically, the sensor panel 30 is a rectangular member disposed under the touch surface 3a, which is a flat surface, and includes a plurality of sensor electrodes. The sensor controller 31 is an integrated circuit individually connected to each of the sensor electrodes in the sensor panel 30 through a corresponding one of a plurality of FPC wires FLx and FLy disposed in flexible printed circuit boards. The sensor controller 31 performs a process of periodically transmitting the uplink signal US by using some or all of the sensor electrodes in the sensor panel 30, and receiving the downlink signal DS transmitted by the pen 2 in response to the uplink signal US through the sensor panel 30.

In the case where the position signal is received from the pen 2 undetected, the sensor controller 31 acquires a reception intensity of the position signal at each of all the sensor electrodes and derives a distribution curve of reception intensity from the result thereof, thereby deriving the position of the pen 2 in the touch surface 3a (global scan). Meanwhile, in the case where the position signal is received from the pen 2 already detected, the sensor controller 31 acquires a reception intensity of the position signal at each of a specified number of sensor electrodes positioned in the vicinity of a position derived in the previous instance and derives a distribution curve of reception intensity from the result thereof, thereby updating the position of the pen 2 in the touch surface 3a (local scan). In the case where the data signal is received from the pen 2, the sensor controller 31 receives the data signal at one or a specified number of sensor electrodes positioned in the vicinity of the position derived in the previous instance and demodulates the data signal, thereby acquiring the data transmitted by the pen 2. The sensor controller 31 is configured to supply the position derived and the data acquired in the above-described manners to the host processor 33 as often as necessary.

The host processor 33 is a central processing unit of the electronic device 3 and performs functions of executing an operating system of the electronic device 3 and various types of applications by reading and executing programs stored in a memory, which is not illustrated in the figure. The applications executed by the host processor 33 include a drawing application.

The drawing application is a program for causing the host processor 33 to perform a process of generating stroke data on the basis of positions and data sequentially supplied from the sensor controller 31. Other processes that the drawing application causes the host processor 33 to perform include a process of storing the generated stroke data in the memory, a process of generating a video signal by subjecting the generated stroke data to rendering, and a process of supplying the generated video signal to the display 32 to display the generated stroke data on the display 32.

The display 32 is a display device including a display panel having a plurality of pixels arranged in a matrix, and a drive circuit for driving the display panel to present a desired display. Specific examples of the display 32 include a liquid crystal display, an organic electroluminescence (EL) display, and an electronic paper. The drive circuit is configured to drive each pixel of the display panel according to the video signal supplied from the host processor 33.

Figure 2:
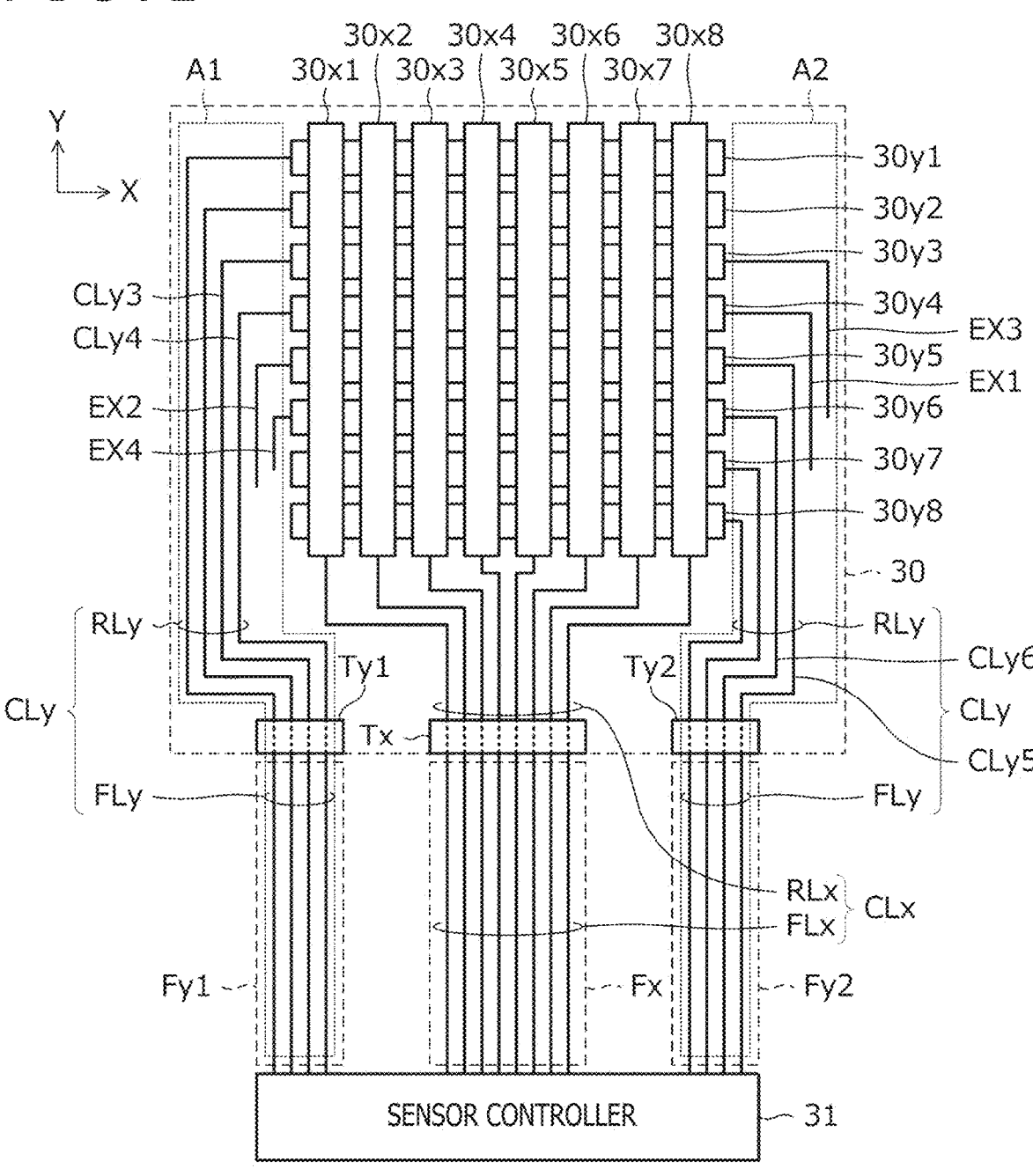
FIG. 2 is a diagram illustrating the configuration of a position detection device illustrated in FIG. 1 in detail.

FIG. 2 is a diagram illustrating the configuration of the position detection device 34 in detail. As illustrated in this figure, the sensor panel 30 includes, as the above-described plurality of sensor electrodes, a plurality of X electrodes 30x each extending in a Y direction and arranged at regular intervals in an X direction perpendicular to the Y direction, and a plurality of Y electrodes 30y each extending in the X direction and arranged at regular intervals in the Y direction. Note that, in FIG. 2 and figures to be referenced later, only eight X electrodes 30x (i.e., X electrodes 30x1 to 30x8) and eight Y electrodes 30y (i.e., Y electrodes 30y1 to 30y8) are illustrated for simpler illustration, but in reality, more X electrodes 30x and more Y electrodes 30y are provided.

The sensor panel 30 is connected to the sensor controller 31 through three flexible printed circuit boards Fx, Fy1, and Fy2. A plurality of FPC wires FLx corresponding to the respective X electrodes 30x are arranged to extend in the flexible printed circuit board Fx. Similarly, a plurality of FPC wires FLy corresponding to respective ones of some of the plurality of Y electrodes 30y (specifically, the Y electrodes 30y1 to 30y4) are arranged to extend in the flexible printed circuit board Fy1, while a plurality of FPC wires FLy corresponding to respective ones of the rest of the plurality of Y electrodes 30y (specifically, the Y electrodes 30y5 to 30y8) are arranged to extend in the flexible printed circuit board Fy2.

Each of the plurality of X electrodes 30x is connected to the sensor controller 31 through a plurality of connection wires CLx. Each connection wire CLx includes a routing line RLx arranged to extend in the sensor panel 30, and the above-described FPC wire FLx. An FPC terminal Tx for connecting the flexible printed circuit board Fx to the sensor panel 30 is disposed at a central portion of an end portion of the sensor panel 30 on one side in the Y direction, and the routing line RLx and the FPC wire FLx that form each connection wire CLx are connected to each other in the FPC terminal Tx. In addition, the routing line RLx of each connection wire CLx is connected to an end portion (i.e., an end portion on the side closer to the terminal Tx) of the corresponding X electrode 30x on the one side in the Y direction. Hereinafter, the connection wires CLx connected to the X electrodes 30x1 to 30x8 will sometimes be referred to as connection wires CLx1 to CLx8, respectively.

In addition, each of the plurality of Y electrodes 30y is connected to the sensor controller 31 through a plurality of connection wires CLy. Each connection wire CLy includes a routing line RLy arranged to extend in the sensor panel 30, and the above-described FPC wire FLy. FPC terminals Ty1 and Ty2 for connecting the flexible printed circuit boards Fy1 and Fy2, respectively, to the sensor panel 30 are disposed at opposite end portions (i.e., on opposite sides of the FPC terminal Tx) of the end portion of the sensor panel 30 on the one side in the Y direction, and the routing line RLy and the FPC wire FLy that form each connection wire CLy are connected to each other in the FPC terminal Ty1 or the FPC terminal Ty2. Hereinafter, the connection wires CLy connected to the Y electrodes 30y1 to 30y8 will sometimes be referred to as connection wires CLy1 to CLy8, respectively.

Some of the plurality of connection wires CLy (specifically, the connection wires CLy1 to CLy4) are arranged to extend at regular intervals in a region A1 (i.e., a first region) that lies over an end portion of the sensor panel 30 on one side in the X direction and the flexible printed circuit board Fy1, while the rest of the plurality of connection wires CLy (specifically, the connection wires CLy5 to CLy8) are arranged to extend at regular intervals in a region A2 (i.e., a second region) that lies over an end portion of the sensor panel 30 on an opposite side in the X direction and the flexible printed circuit board Fy2. Each of the connection wires CLy arranged to extend in the region A1 is connected to an end portion (i.e., an end portion on the side closer to the region A1) of the corresponding Y electrode 30y on the one side in the X direction. Meanwhile, each of the connection wires CLy arranged to extend in the region A2 is connected to an end portion (i.e., an end portion on the side closer to the region A2) of the corresponding Y electrode 30y on the opposite side in the X direction.

In addition to the above-described rest of the plurality of connection wires CLy, two extension lines EX1 and EX3 are arranged to extend in the region A2. Similarly, in addition to the above-described some of the plurality of connection wires CLy, two extension lines EX2 and EX4 are arranged to extend in the region A1. The extension line EX1 (i.e., a first extension line) is a wire connected to an end portion (i.e., an end portion on the side closer to the region A2) of the Y electrode 30y4 (i.e., a first sensor electrode) on the opposite side in the X direction, and is arranged to extend along the connection wire CLy5 (i.e., a second connection wire). The extension line EX2 (i.e., a second extension line) is a wire connected to an end portion (i.e., an end portion on the side closer to the region A1) of the Y electrode 30y5 (i.e., a second sensor electrode) on the one side in the X direction, and is arranged to extend along the connection wire CLy4 (i.e., a first connection wire). The extension line EX3 (i.e., a third extension line) is a wire connected to an end portion (i.e., an end portion on the side closer to the region A2) of the Y electrode 30y3 (i.e., a third sensor electrode), which is adjacent to the Y electrode 30y5 with the Y electrode 30y4 intervening therebetween, on the opposite side in the X direction, and is arranged to extend along the extension line EX1. The extension line EX4 (i.e., a fourth extension line) is a wire connected to an end portion (i.e., an end portion on the side closer to the region A1) of the Y electrode 30y6 (i.e., a fourth sensor electrode), which is adjacent to the Y electrode 30y4 with the Y electrode 30y5 intervening therebetween, on the one side in the X direction, and is arranged to extend along the extension line EX2.

Through provision of the extension lines EX1 to EX4, the sensor panel 30 and the position detection device 34 according to the present embodiment are able to minimize a reduction in accuracy in deriving the position which is caused by arranging the plurality of connection wires CLy to extend in the regions A1 and A2 in a distributed manner. This regard will now be described in detail below.

Figure 3:
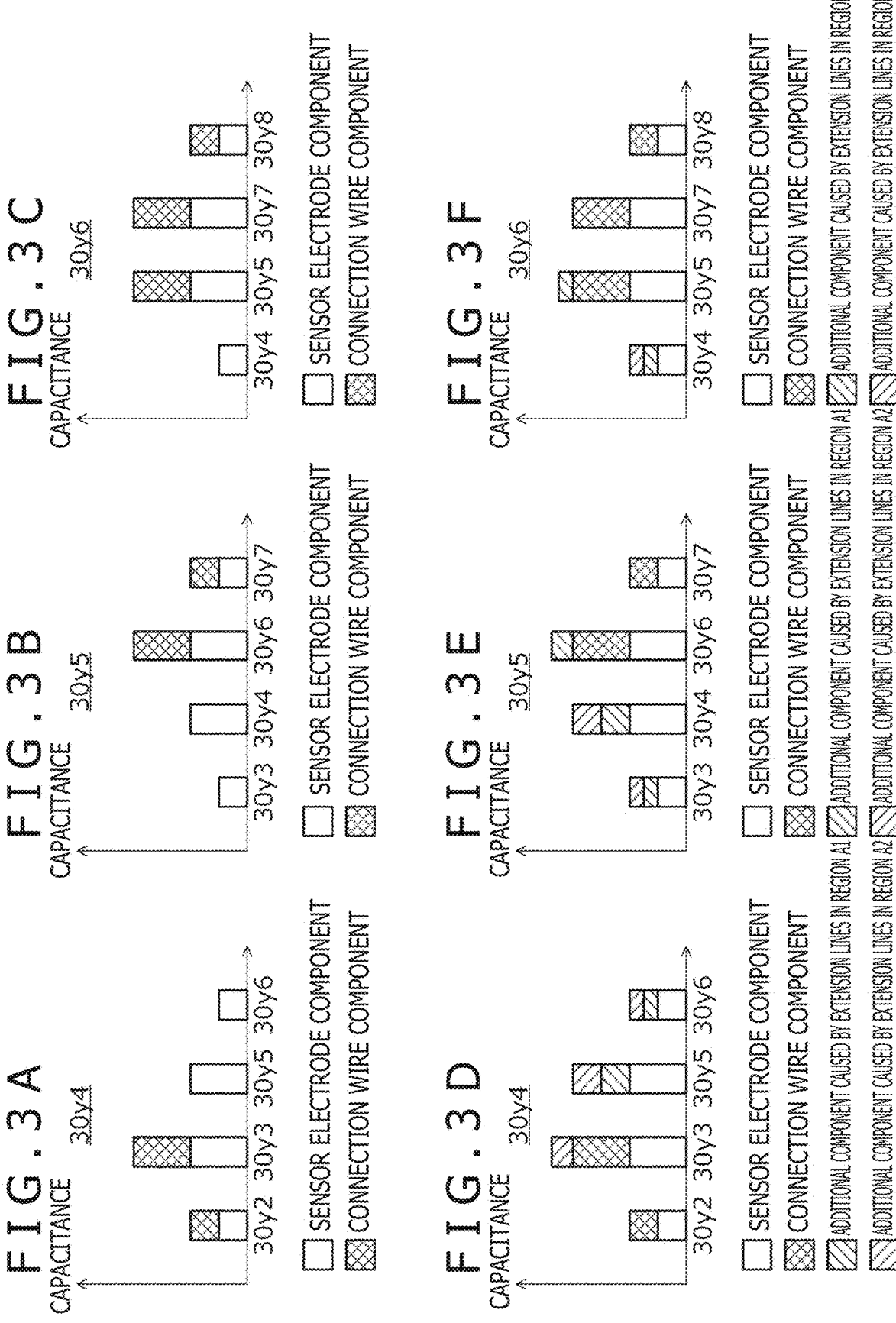

FIGS. 3A, 3B, and 3C are diagrams schematically illustrating the distributions of coupling capacitance with the Y electrodes 30y4, 30y5, and 30y6, respectively, as a center in a comparative example in which the extension lines EX1 to EX4 are eliminated from the sensor panel 30 illustrated in FIG. 2. Each Y electrode 30y has coupling capacitance in relation to another Y electrode 30y, and this coupling capacitance includes a component (i.e., a sensor electrode component) caused by direct adjacency with the other Y electrode 30y, and a component (i.e., a connection wire component) caused by adjacency between the connection wire CLy connected to the Y electrode 30y and another connection wire CLy.

First, referring to FIG. 3A, the Y electrode 30y4 has a connection wire component of coupling capacitance in relation to each of the Y electrodes 30y2 and 30y3, but does not have a connection wire component of coupling capacitance in relation to either of the Y electrodes 30y5 and 30y6. This is because the connection wires CLy2 to CLy4 are arranged to extend in the region A1 while the connection wires CLy5 and CLy6 are arranged to extend in the region A2.

Next, referring to FIG. 3B, the Y electrode 30y5 has a connection wire component of coupling capacitance in relation to each of the Y electrodes 30y6 and 30y7, but does not have a connection wire component of coupling capacitance in relation to either of the Y electrodes 30y3 and 30y4. This is because the connection wires CLy5 to CLy7 are arranged to extend in the region A2 while the connection wires CLy3 and CLy4 are arranged to extend in the region A1.

Next, referring to FIG. 3C, the Y electrode 30y6 has a connection wire component of coupling capacitance in relation to each of the Y electrodes 30y5 to 30y8, but does not have a connection wire component of coupling capacitance in relation to the Y electrode 30y4. This is because the connection wires CLy5 to CLy8 are arranged to extend in the region A2 while the connection wire CLy4 is arranged to extend in the region A1.

As will be understood by comparing FIGS. 3A to 3C with one another, the distributions of coupling capacitance with the Y electrodes 30y4, 30y5, and 30y6, respectively, as the center are significantly different from one another due to differences in the connection wire components of coupling capacitance. Such differences in the distribution of coupling capacitance between the Y electrodes 30y cause a distortion of the above-described distribution curve (i.e., the distribution curve of reception intensity of the position signal), resulting in reduced accuracy of the position derivation by the sensor controller 31.

FIGS. 3D, 3E, and 3F are diagrams schematically illustrating the distributions of coupling capacitance with the Y electrodes 30y4, 30y5, and 30y6, respectively, as a center according to the present embodiment. In the present embodiment, the above-described provision of the extension lines EX1 to EX4 causes additional coupling capacitance between the Y electrodes 30y. Thus, in FIGS. 3D to 3F, in addition to the sensor electrode components and the connection wire components illustrated in FIGS. 3A to 3C, additional components of coupling capacitance caused by the extension lines EX2 and EX4 in the region A1 (i.e., additional components caused by the extension lines in the region A1) and additional components of coupling capacitance caused by the extension lines EX1 and EX3 in the region A2 (i.e., additional components caused by the extension lines in the region A2) are illustrated.

First, referring to FIG. 3D, the connection wire CLy4 connected to the Y electrode 30y4 is adjacent to the extension lines EX2 and EX4 in the region A1 as illustrated in FIG. 2. As a result, additional components caused by the extension lines in the region A1 are added to the coupling capacitance in relation to each of the Y electrodes 30y5 and 30y6. Meanwhile, the extension line EX1 connected to the Y electrode 30y4 is adjacent to the extension line EX3 and the connection wires CLy5 and CLy6 in the region A2. As a result, additional components caused by the extension lines in the region A2 are added to the coupling capacitance in relation to each of the Y electrodes 30y3, 30y5, and 30y6.

Next, referring to FIG. 3E, the connection wire CLy5 connected to the Y electrode 30y5 is adjacent to the extension lines EX1 and EX3 in the region A2. As a result, additional components caused by the extension lines in the region A2 are added to the coupling capacitance in relation to each of the Y electrodes 30y3 and 30y4. Meanwhile, the extension line EX2 connected to the Y electrode 30y5 is adjacent to the connection wires CLy3 and CLy4 and the extension line EX4 in the region A1. As a result, additional components caused by the extension lines in the region A1 are added to the coupling capacitance in relation to each of the Y electrodes 30y3, 30y4, and 30y6.

Next, referring to FIG. 3F, the connection wire CLy6 connected to the Y electrode 30y6 is adjacent to the extension line EX1 in the region A2. As a result, an additional component caused by the extension line in the region A2 is added to the coupling capacitance in relation to the Y electrode 30y4. Meanwhile, the extension line EX4 connected to the Y electrode 30y6 is adjacent to the connection wire CLy4 and the extension line EX2 in the region A1. As a result, additional components caused by the extension lines in the region A1 are added to the coupling capacitance in relation to each of the Y electrodes 30y4 and 30y5.

As will be understood by comparing FIGS. 3D to 3F with FIGS. 3A to 3C, the position detection device 34 according to the present embodiment achieves a reduction in the differences between the distributions of coupling capacitance with the Y electrodes 30y4, 30y5, and 30y6, respectively, as the center when compared to the comparative example. This leads to a reduced distortion of the above-described distribution curve (i.e., the distribution curve of reception intensity of the position signal) when compared to the comparative example, and it can therefore be said that the sensor panel 30 and the position detection device 34 according to the present embodiment are able to minimize the reduction in accuracy in deriving the position which is caused by arranging the plurality of connection wires CLy to extend in the regions A1 and A2 in a distributed manner.

As described above, the sensor panel 30 and the position detection device 34 according to the present embodiment are able to cause the distribution of coupling capacitance with each Y electrode 30y as the center to fall within a substantially fixed range, and are therefore able to minimize the reduction in accuracy in deriving the position which is caused by arranging the connection wires CLy to extend in the regions A1 and A2 in a distributed manner.

Note that, while the four extension lines EX1 to EX4 are disposed in the sensor panel 30 in the present embodiment described above, only the extension lines EX1 and EX2 may be disposed while the extension lines EX3 and EX4 are omitted. Also note that more than four extension lines may be disposed therein. Also note that the length of each extension line is not limited to the length thereof illustrated in FIG. 2, and should be determined such that the distribution of coupling capacitance with each Y electrode 30y as the center can fall within a substantially fixed range. These regards apply to first and second modifications described below as well.

Figure 4:
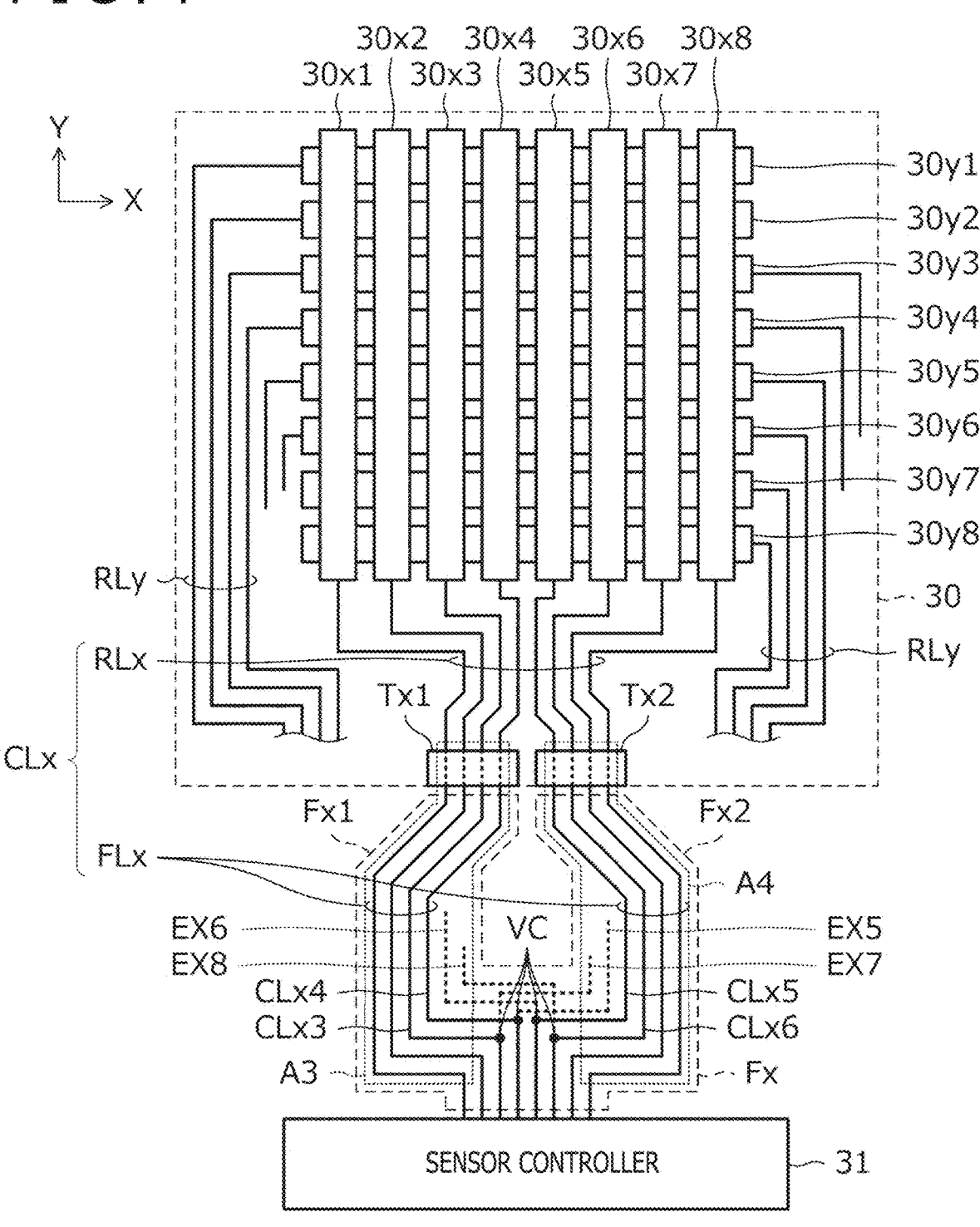
FIG. 4 is a diagram illustrating the configuration of a position detection device according to a first modification of the first embodiment of the present disclosure in detail.

FIG. 4 is a diagram illustrating the configuration of a position detection device 34 according to a first modification of the present embodiment in detail. The position detection device 34 according to the present modification is different from the position detection device 34 according to the present embodiment in the configuration concerning the plurality of connection wires CLx, and is otherwise similar to the position detection device 34 according to the present embodiment. Note that, while part of the configuration concerning the plurality of connection wires CLy is not illustrated in FIG. 4, the omitted part of the configuration is the same as illustrated in FIG. 2. The following description is provided with a focus placed on differences from the position detection device 34 according to the present embodiment.

The present modification corresponds to a case where the FPC terminal Tx needs to be divided into two FPC terminals Tx1 and Tx2 because, for example, the number of X electrodes 30x is great. A sensor panel 30 according to the present modification is connected to a sensor controller 31 through a flexible printed circuit board Fx that branches out into two parts on the side closer to the sensor panel 30. Hereinafter, one of the two parts branching out from the flexible printed circuit board Fx which is connected to the FPC terminal Tx1 will be referred to as a flexible printed circuit board Fx1 (i.e., a first flexible printed circuit board), while the other part, which is connected to the FPC terminal Tx2, will be referred to as a flexible printed circuit board Fx2 (i.e., a second flexible printed circuit board).

Some of the plurality of connection wires CLx (specifically, the connection wires CLx1 to CLx4) are arranged to extend at regular intervals in a region A3 (i.e., the first region) that lies over the FPC terminal Tx1 and the flexible printed circuit board Fx1, while the rest of the plurality of connection wires CLx (specifically, the connection wires CLx5 to CLx8) are arranged to extend at regular intervals in a region A4 (i.e., the second region) that lies over the FPC terminal Tx2 and the flexible printed circuit board Fx2.

In addition to the above-described rest of the plurality of connection wires CLx, two extension lines EX5 and EX7 are arranged to extend in the region A4. Similarly, in addition to the above-described some of the plurality of connection wires CLx, two extension lines EX6 and EX8 are arranged to extend in the region A3. Here, the flexible printed circuit board Fx is a multi-layer board, and the extension lines EX5 to EX8 are arranged to extend in layers different from a layer in which each of the connection wires CLx1 to CLx8 extends. This is an arrangement to prevent a contact between the extension lines EX5 to EX8 and the connection wires CLx1 to CLx8 except through via hole conductors VC, which will be described below. In addition, the extension lines EX5 and EX7 and the extension lines EX6 and EX8 are also arranged to extend in mutually different layers to prevent a contact therebetween.

The extension line EX5 (i.e., the first extension line) is a wire connected to the connection wire CLx4 through a via hole conductor VC arranged to pass from layer to layer, and is arranged to extend along the connection wire CLx5 (i.e., the second connection wire). The extension line EX6 (i.e., the second extension line) is a wire connected to the connection wire CLx5 through a via hole conductor VC, and is arranged to extend along the connection wire CLx4 (i.e., the first connection wire). The extension line EX7 (i.e., the third extension line) is a wire connected to the connection wire CLx3 through a via hole conductor VC, and is arranged to extend along the extension line EX5. The extension line EX8 (i.e., the fourth extension line) is a wire connected to the connection wire CLx6 through a via hole conductor VC, and is arranged to extend along the extension line EX6.

The above-described configuration enables the sensor panel 30 and the position detection device according to the present modification to cause the distribution of coupling capacitance with each X electrode 30x as the center to fall within a substantially fixed range for the same reason as in the present embodiment. This in turn makes it possible to minimize a reduction in accuracy in deriving a position which is caused by arranging the connection wires CLx to extend in the regions A3 and A4 in a distributed manner.

Figure 5:
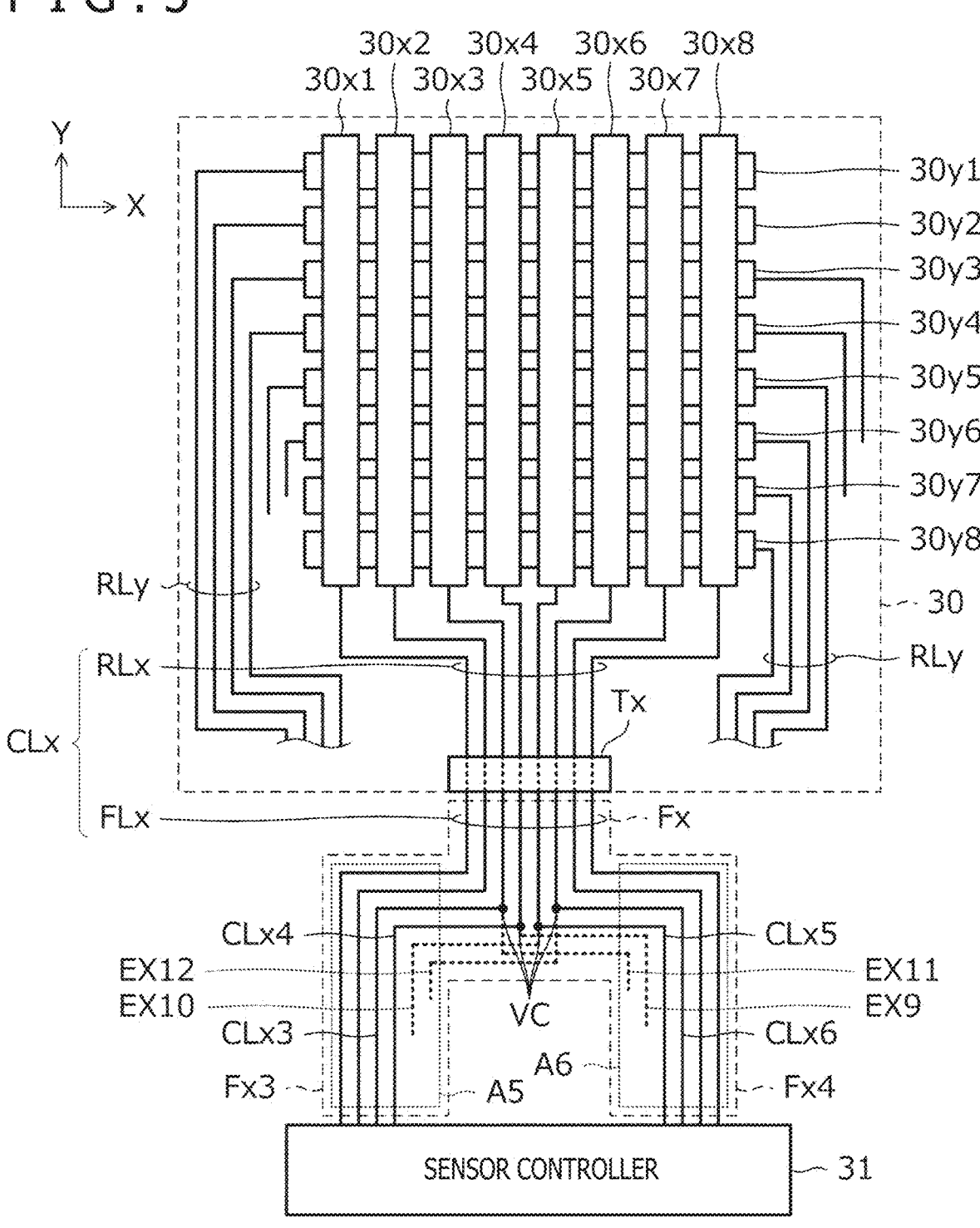
FIG. 5 is a diagram illustrating the configuration of a position detection device according to a second modification of the first embodiment of the present disclosure in detail.

FIG. 5 is a diagram illustrating the configuration of a position detection device 34 according to a second modification of the present embodiment in detail. The position detection device 34 according to the present modification is also different from the position detection device 34 according to the present embodiment in the configuration concerning the plurality of connection wires CLx, and is otherwise similar to the position detection device 34 according to the present embodiment. Note that, while part of the configuration concerning the plurality of connection wires CLy is not illustrated in FIG. 5, the omitted part of the configuration is the same as illustrated in FIG. 2. The following description is provided with a focus placed on differences from the position detection device 34 according to the present embodiment.

The present modification corresponds to a case where a flexible printed circuit board connected to a sensor controller 31 needs to be divided into two boards because, for example, the number of X electrodes 30x is great. A sensor panel 30 according to the present modification is connected to the sensor controller 31 through a flexible printed circuit board Fx that branches out into two parts on the side closer to the sensor controller 31. Hereinafter, one of the two parts branching out from the flexible printed circuit board Fx will be referred to as a flexible printed circuit board Fx3 (i.e., the first flexible printed circuit board), while the other part will be referred to as a flexible printed circuit board Fx4 (i.e., the second flexible printed circuit board).

Some of the plurality of connection wires CLx (specifically, the connection wires CLx1 to CLx4) are arranged to extend at regular intervals in a region A5 (i.e., the first region) that lies in the flexible printed circuit board Fx3, while the rest of the plurality of connection wires CLx (specifically, the connection wires CLx5 to CLx8) are arranged to extend at regular intervals in a region A6 (i.e., the second region) that lies in the flexible printed circuit board Fx4.

In addition to the above-described rest of the plurality of connection wires CLx, two extension lines EX9 and EX11 are arranged to extend in the region A6. Similarly, in addition to the above-described some of the plurality of connection wires CLx, two extension lines EX10 and EX12 are arranged to extend in the region A5. In the present modification as well, the flexible printed circuit board Fx is a multi-layer board, and the extension lines EX9 to EX12 are arranged to extend in layers different from a layer in which each of the connection wires CLx1 to CLx8 extends. In addition, the extension lines EX9 and EX11 and the extension lines EX10 and EX12 are also arranged to extend in mutually different layers to prevent a contact therebetween.

The extension line EX9 (i.e., the first extension line) is a wire connected to the connection wire CLx4 through a via hole conductor VC, and is arranged to extend along the connection wire CLx5 (i.e., the second connection wire). The extension line EX10 (i.e., the second extension line) is a wire connected to the connection wire CLx5 through a via hole conductor VC, and is arranged to extend along the connection wire CLx4 (i.e., the first connection wire). The extension line EX11 (i.e., the third extension line) is a wire connected to the connection wire CLx3 through a via hole conductor VC, and is arranged to extend along the extension line EX9. The extension line EX12 (i.e., the fourth extension line) is a wire connected to the connection wire CLx6 through a via hole conductor VC, and is arranged to extend along the extension line EX10.

The above-described configuration enables the sensor panel 30 and the position detection device according to the present modification to cause the distribution of coupling capacitance with each X electrode 30x as the center to fall within a substantially fixed range for the same reason as in the present embodiment and the first modification. This in turn makes it possible to minimize a reduction in accuracy in deriving a position which is caused by arranging the connection wires CLx to extend in the regions A5 and A6 in a distributed manner.

Next, a position detection system 1 according to a second embodiment of the present disclosure will be described below. The position detection system 1 according to the present embodiment is different from the position detection system 1 according to the first embodiment in that dummy lines that are not connected to any sensor electrode are provided in place of the extension lines connected to the sensor electrodes and in processes performed by the sensor controller 31, and is similar to the position detection system 1 according to the first embodiment in other respects including the system configuration illustrated in FIG. 1. The following description is provided with a focus placed on differences from the position detection system 1 according to the first embodiment.

Figure 6:
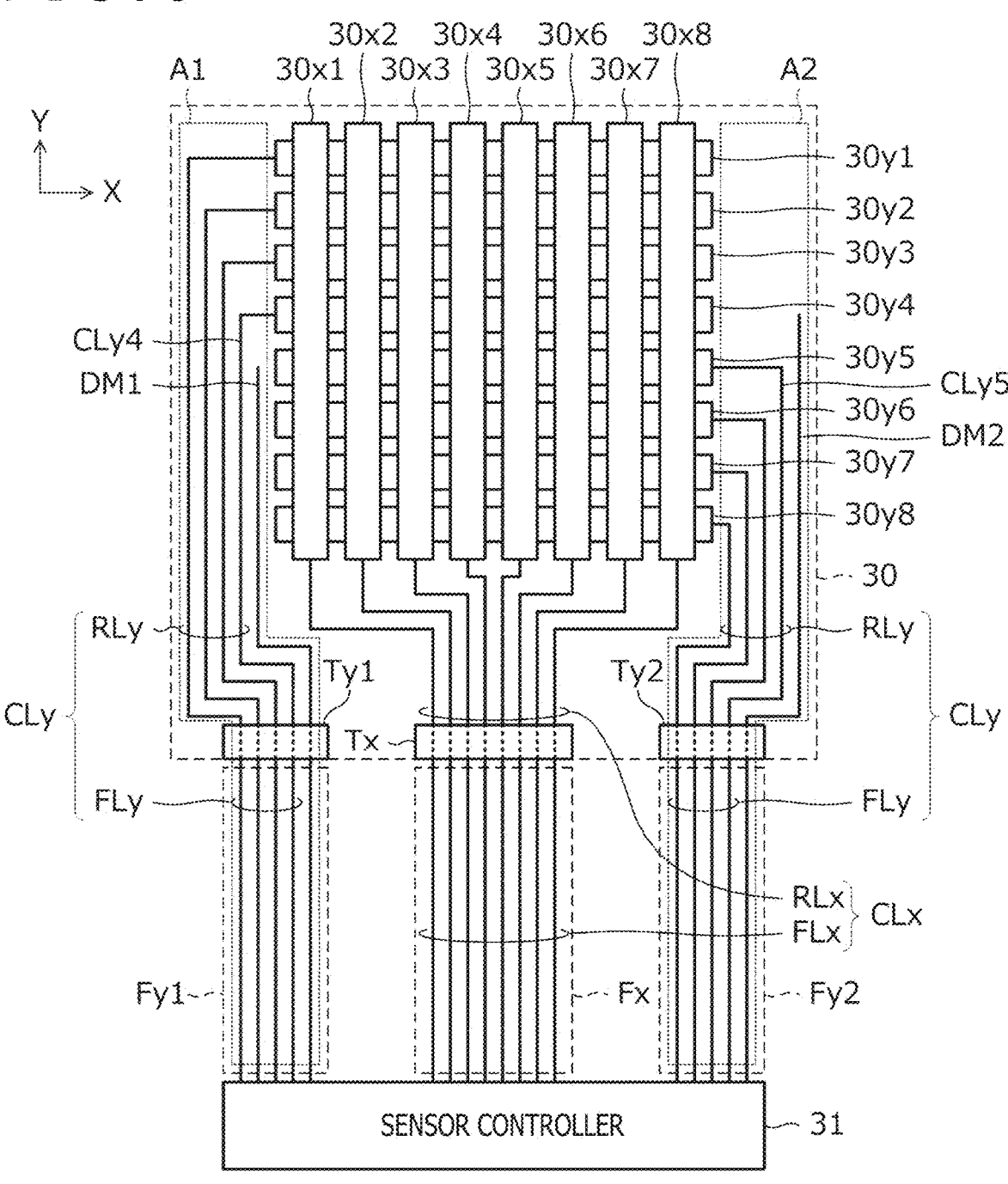
FIG. 6 is a diagram illustrating the configuration of a position detection device according to a second embodiment of the present disclosure in detail.

FIG. 6 is a diagram illustrating the configuration of a position detection device 34 according to the present embodiment in detail. To compare this figure with FIG. 2, the position detection device 34 according to the present embodiment is different from the position detection device 34 according to the first embodiment in including dummy lines DM1 and DM2 and not including the extension lines EX1 to EX4.

The dummy line DM1 (i.e., a first dummy line) is a wire arranged to extend along a connection wire CLy4 (i.e., the first connection wire) in a region A1, and includes a routing line formed in a sensor panel 30 and an FPC wire formed in a flexible printed circuit board Fy1. The routing line and the FPC wire that form the dummy line DM1 are connected to each other in an FPC terminal Ty1.

The dummy line DM2 (i.e., a second dummy line) is a wire arranged to extend along a connection wire CLy5 (i.e., the second connection wire) in a region A2, and includes a routing line formed in the sensor panel 30 and an FPC wire formed in a flexible printed circuit board Fy2. The routing line and the FPC wire that form the dummy line DM2 are connected to each other in an FPC terminal Ty2.

Each of the dummy lines DM1 and DM2 is connected to the sensor controller 31, but is not connected to any of a plurality of X electrodes 30x and a plurality of Y electrodes 30y. The sensor controller 31 according to the present embodiment is configured to derive a distribution curve of reception intensity employing the above-described differential method, and employs the dummy lines DM1 and DM2 when deriving a differential between a reception intensity at the Y electrode 30y4 and a reception intensity at the Y electrode 30y5. The processes performed by the sensor controller 31 will be described in detail below. Processes performed by a sensor controller 31 in related art and a problem thereof are first described with reference to FIGS. 7A, 7B, and 7C, and processes performed by the sensor controller 31 according to the present embodiment are then described with reference to FIG. 8.

Figure 7A:
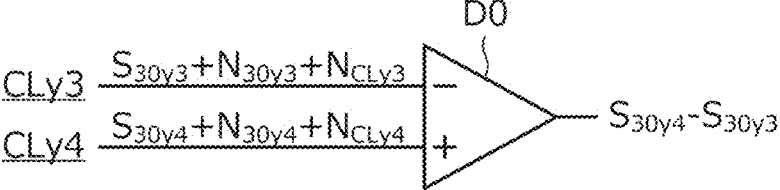
FIGS. 7A, 7B, and 7C are each a diagram illustrating a circuit provided in a sensor controller in related art.
Figure 7B:
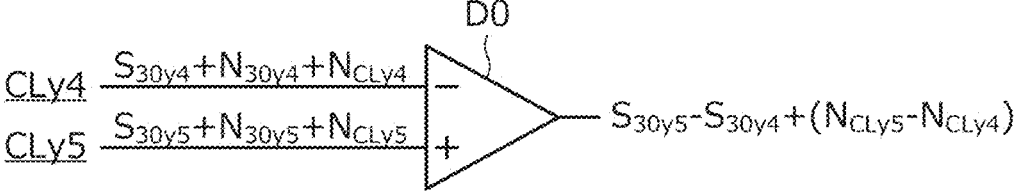
Figure 7C:
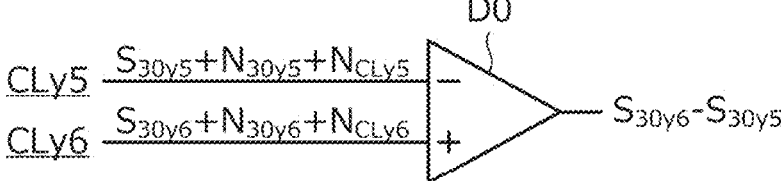

FIGS. 7A to 7C are each a diagram illustrating a circuit provided in the sensor controller 31 in related art. FIG. 7A represents a circuit for deriving a differential between a reception intensity at the Y electrode 30$y$3 and a reception intensity at the Y electrode 30$y$4, FIG. 7B represents a circuit for deriving a differential between a reception intensity at the Y electrode 30$y$4 and a reception intensity at the Y electrode 30$y$5, and FIG. 7C represents a circuit for deriving a differential between a reception intensity at the Y electrode 30$y$5 and a reception intensity at the Y electrode 30$y$6. While not illustrated in the figures, circuits for deriving differentials between reception intensities at other sensor electrodes have similar configurations.

Referring to FIG. 7A, for example, the sensor controller 31 includes a two-input subtraction circuit DO having an inverting input terminal connected to the connection wire CLy3 and a non-inverting input terminal connected to the connection wire CLy4. A signal supplied from the connection wire CLy3 to the sensor controller 31 includes a signal component $S_{30y3}$ and a noise component $N_{30y3}$ received at the Y electrode 30$y$3, and a noise component $N_{CLy3}$ received at the connection wire CLy3 connected to the Y electrode 30$y$3. Similarly, a signal supplied from the connection wire CLy4 to the sensor controller 31 includes a signal component $S_{30y4}$ and a noise component $N_{30y4}$ received at the Y electrode 30$y$4, and a noise component $N_{CLy4}$ received at the connection wire CLy4 connected to the Y electrode 30$y$4.

Here, because the Y electrode 30$y$3 and the Y electrode 30$y$4 are adjacent to each other, the noise component $N_{30y3}$ and the noise component $N_{30y4}$ can be considered to have the same value. Similarly, because the connection wire CLy3 and the connection wire CLy4 are adjacent to each other, the noise component $N_{CLy3}$ and the noise component $N_{CLy4}$ can also be considered to have the same value. Accordingly, when a differential between the signal supplied from the Y electrode 30$y$4 to the sensor controller 31 and the signal supplied from the Y electrode 30$y$3 to the sensor controller 31 is derived, the four noise components $N_{30y3}$, $N_{CLy3}$, $N_{30y4}$, and $N_{CLy4}$ are canceled out as illustrated in FIG. 7A, leaving only a differential, $S_{30y4}-S_{30y3}$, between the signal components.

The above regard basically applies to the differentials between reception intensities at other sensor electrodes as well except that, as illustrated in FIG. 7B, a noise component $N_{CLy5}-N_{CLy4}$ is left in the differential between the reception intensity at the Y electrode 30$y$4 and the reception intensity at the Y electrode 30$y$5. This is because the connection wire CLy4 and the connection wire CLy5 are not adjacent to each other as a result of the plurality of connection wires CLy being arranged in the regions A1 and A2 in a distributed manner. The noise component left in the differential between the reception intensities causes a distortion in a derived distribution curve, leading to reduced accuracy of position derivation by the sensor controller 31.

Figure 8:
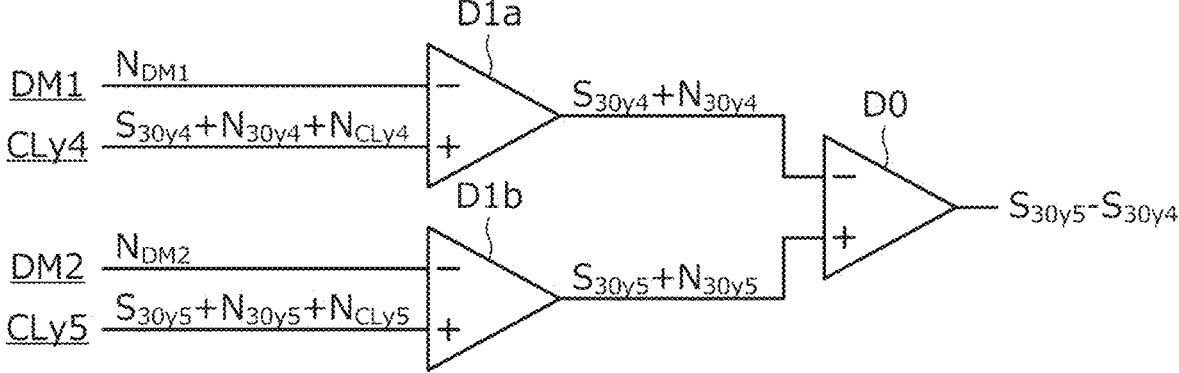
FIG. 8 is a diagram illustrating a circuit provided in a sensor controller according to the second embodiment of the present disclosure.

FIG. 8 is a diagram illustrating a circuit provided in the sensor controller 31 according to the present embodiment. While only a circuit for deriving the differential between the reception intensity at the Y electrode 30$y$4 and the reception intensity at the Y electrode 30$y$5 is illustrated in this figure, circuits for deriving differentials between reception intensities at other sensor electrodes have a configuration similar to the configuration illustrated in FIGS. 7A and 7C.

As illustrated in FIG. 8, the sensor controller 31 includes two two-input subtraction circuits D1$a$ and D1$b$ provided in a stage previous to a subtraction circuit DO. An inverting input terminal of the subtraction circuit D1$a$ is connected to the dummy line DM1, a non-inverting input terminal thereof is connected to the connection wire CLy4, and an output terminal thereof is connected to an inverting input terminal of the subtraction circuit DO. Meanwhile, an inverting input terminal of the subtraction circuit D1$b$ is connected to the dummy line DM2, a non-inverting input terminal thereof is connected to the connection wire CLy5, and an output terminal thereof is connected to a non-inverting input terminal of the subtraction circuit DO.

A signal supplied from the dummy line DM1 to the sensor controller 31 includes a noise component $N_{DM1}$ received at the dummy line DM1. Here, as illustrated in FIG. 6, the dummy line DM1 is arranged to extend along the connection wire CLy4, and therefore, the noise component $N_{CLy4}$ and the noise component $N_{DM1}$ can be considered to have the same value. Accordingly, an output signal (i.e., a first differential signal) outputted from the subtraction circuit D1$a$ corresponds to $S_{30y4}+N_{30y4}$. Similarly, a signal supplied from the dummy line DM2 to the sensor controller 31 includes a noise component $N_{DM2}$ received at the dummy line DM2. Then, because the dummy line DM2 is arranged to extend along the connection wire CLy5, the noise component $N_{CLy5}$ and the noise component $N_{DM2}$ can be considered to have the same value. Therefore, an output signal (i.e., a second differential signal) outputted from the subtraction circuit D1$b$ corresponds to $S_{30y5}+N_{30y5}$.

Moreover, because the Y electrode 30$y$4 and the Y electrode 30$y$5 are adjacent to each other, the noise component $N_{30y4}$ and the noise component $N_{30y5}$ can be considered to have the same value, and therefore, a signal $S_{30y5}-S_{30y4}$, with the noise components $N_{30y4}$ and $N_{30y5}$ eliminated therefrom, is outputted from an output terminal of the subtraction circuit D0. That is, the position detection device 34 according to the present embodiment is able to eliminate the noise components even from the differential between the reception intensity at the Y electrode 30$y$4 and the reception intensity at the Y electrode 30$y$5, and is therefore able to minimize a reduction in accuracy in deriving a position which is caused by arranging the plurality of connection wires CLy to extend in the regions A1 and A2 in a distributed manner.

As described above, the position detection device 34 according to the present embodiment enables external noises to be canceled out even between the Y electrodes 30$y$4 and 30$y$5, which are adjacent to each other but the respective connection wires CLy connected to which are arranged separately in the regions A1 and A2. Accordingly, when differentials between reception intensities are derived employing the differential method, external noises can be canceled out, and this makes it possible to minimize a reduction in accuracy in deriving a position which is caused by arranging the connection wires CLy to extend in the regions A1 and A2 in a distributed manner.

Note that, while the subtraction circuits are provided in the sensor controller 31 in the above-described present embodiment, it is to be appreciated that subtractions of signals may be performed by digital processing instead of by employing physical subtraction circuits.

Figure 9:
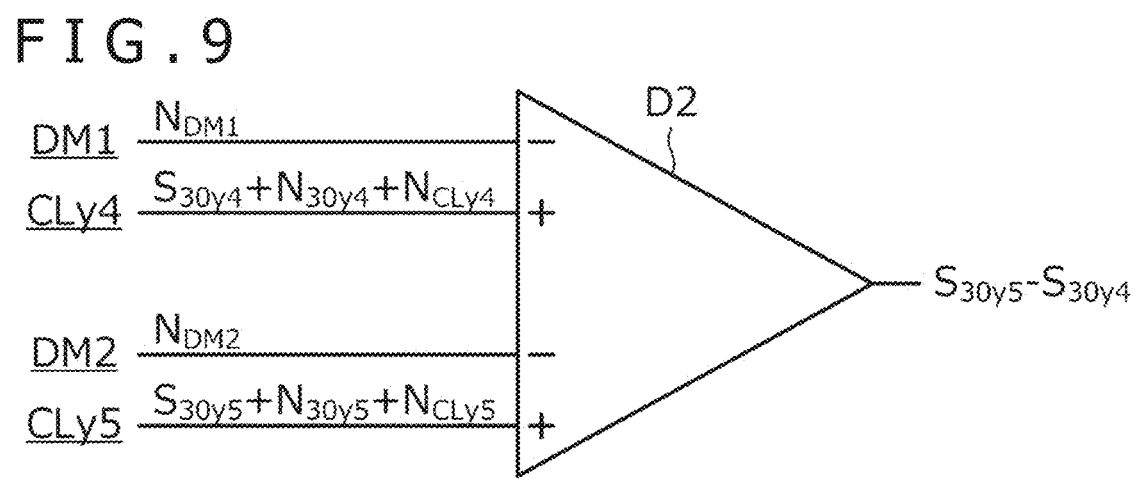

FIG. 9 is a diagram illustrating a circuit provided in a sensor controller 31 according to a first modification of the present embodiment. The circuit illustrated in this figure is an example modification of the circuit illustrated in FIG. 8. Circuits for deriving differentials between reception intensities at other sensor electrodes have a configuration similar to the configuration illustrated in FIGS. 7A and 7C.

The sensor controller 31 according to the present modification is different from the sensor controller 31 according to the present embodiment in using a single four-input subtraction circuit D2 in place of the subtraction circuits D0, D1$a$, and D1$b$. The subtraction circuit D2 has two inverting input terminals and two non-inverting input terminals, and the two inverting input terminals are connected to the respective dummy lines DM1 and DM2, while the two non-inverting input terminals are connected to the respective connection wires CLy4 and CLy5. A signal outputted from the subtraction circuit D2 corresponds to $S_{30y4}+N_{30y4}+N_{CLy4}+S_{30y5}+N_{30y5}+N_{CLy5}-N_{DM1}-N_{DM2}$, but because the noise component $N_{CLy4}$ and the noise component $N_{DM1}$, the noise component $N_{CLy5}$ and the noise component $N_{DM2}$, and the noise component $N_{30y4}$ and the noise component $N_{30y5}$ can be considered to have the same values as described above, all the noise components are eliminated, and a signal actually outputted corresponds to $S_{30y5}-S_{30y4}$. This result is the same as in the case of the example illustrated in FIG. 8. Therefore, similarly to the position detection device 34 according to the present embodiment, a position detection device 34 according to the present modification is also able to minimize a reduction in accuracy in deriving a position which is caused by arranging the connection wires CLy to extend in the regions A1 and A2 in a distributed manner.

Figure 10:
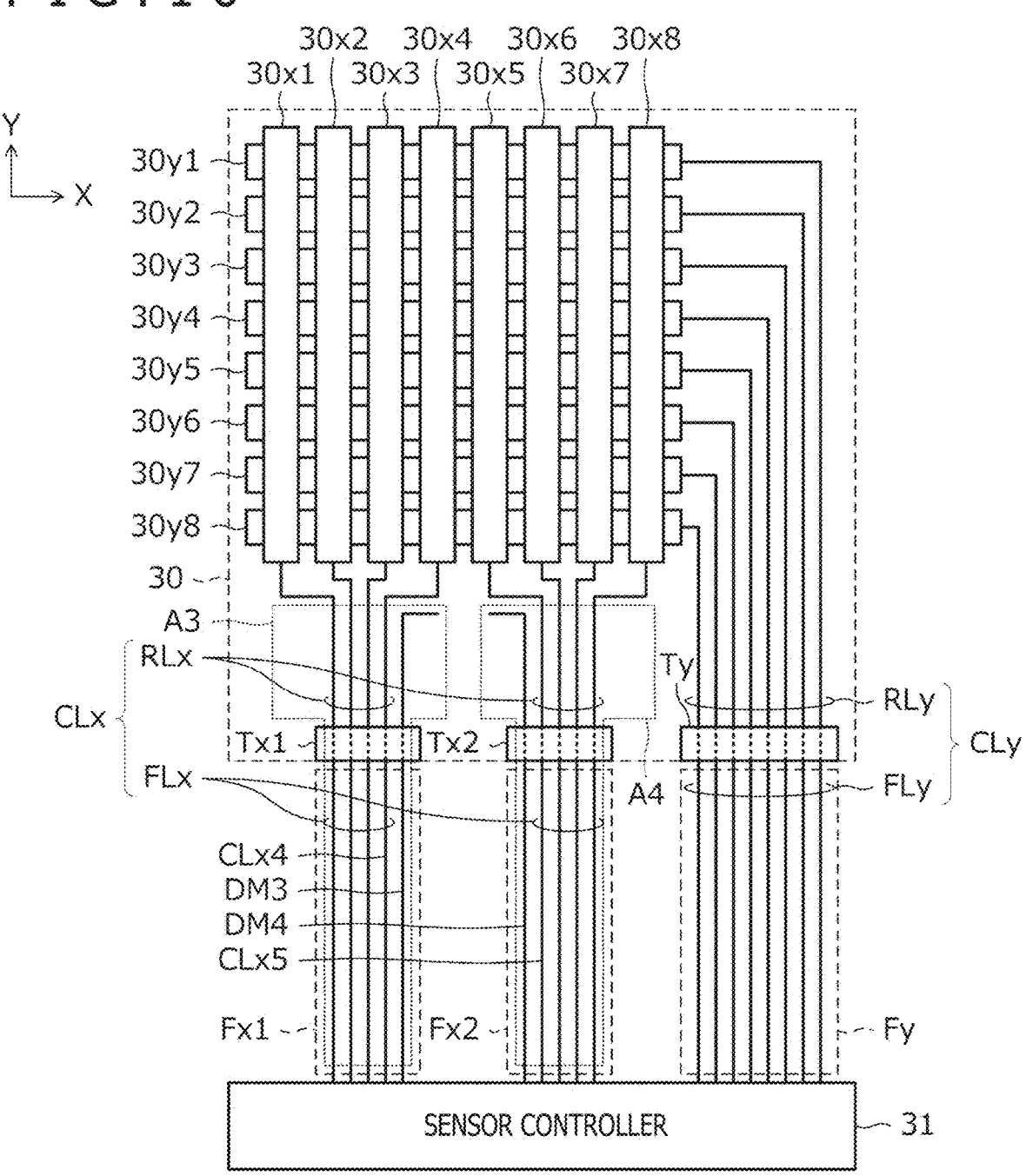
FIG. 10 is a diagram illustrating the configuration of a position detection device according to a second modification of the second embodiment of the present disclosure in detail.

FIG. 10 is a diagram illustrating the configuration of a position detection device 34 according to a second modification of the present embodiment in detail. The position detection device 34 according to the present modification is different from the position detection device 34 according to the present embodiment in that a plurality of connection wires CLy are collectively arranged to extend in a single region while a plurality of connection wires CLx are arranged to extend in two regions in a distributed manner, and in that dummy lines DM3 and DM4 are provided in place of the dummy lines DM1 and DM2, and is otherwise similar to the position detection device 34 according to the present embodiment. The following description is provided with a focus placed on differences from the position detection device 34 according to the present embodiment.

A sensor panel 30 according to the second modification of the present embodiment is connected to a sensor controller 31 through three flexible printed circuit boards Fx1, Fx2, and Fy. A plurality of FPC wires FLy corresponding to respective Y electrodes 30$y$ are arranged to extend in the flexible printed circuit board Fy. Meanwhile, a plurality of FPC wires FLx corresponding to respective ones of some of a plurality of X electrodes 30$x$ (specifically, X electrodes 30$x$1 to 30$x$4) are arranged to extend in the flexible printed circuit board Fx1 (i.e., the first flexible printed circuit board), while a plurality of FPC wires FLx corresponding to respective ones of the rest of the plurality of X electrodes 30$x$ (specifically, X electrodes 30$x$5 to 30$x$8) are arranged to extend in the flexible printed circuit board Fx2 (i.e., the second flexible printed circuit board).

The flexible printed circuit boards Fx1, Fx2, and Fy are connected to FPC terminals Tx1, Tx2, and Ty, respectively, of the sensor panel 30. The FPC terminals Tx1, Tx2, and Ty are arranged in this order from the one side in the X direction in the vicinity of a side that forms an end of the sensor panel 30 on the one side in the Y direction.

A routing line RLy and an FPC wire FLy that form each connection wire CLy are connected to each other in the FPC terminal Ty. In addition, the routing line RLy of each connection wire CLy is connected to an end portion of the corresponding Y electrode 30$y$ on the opposite side in the X direction.

Some of the plurality of connection wires CLx which are connected to the above-described some of the plurality of X electrodes 30$x$ are arranged to extend at regular intervals in a region A3 (i.e., the first region) that lies over an area in the vicinity of the FPC terminal Tx1 and the flexible printed circuit board Fx1, while the rest of the plurality of connection wires CLx are arranged to extend at regular intervals in a region A4 (i.e., the second region) that lies over an area in the vicinity of the FPC terminal Tx2 and the flexible printed circuit board Fx2.

The dummy line DM3 (i.e., the first dummy line) is a wire arranged to extend along the connection wire CLx4 (i.e., the first connection wire) in the region A3, and includes a routing line formed in the sensor panel 30 and an FPC wire formed in the flexible printed circuit board Fx1. The routing line and the FPC wire that form the dummy line DM3 are connected to each other in the FPC terminal Tx1.

The dummy line DM4 (i.e., the second dummy line) is a wire arranged to extend along the connection wire CLx5 (i.e., the second connection wire) in the region A4, and includes a routing line formed in the sensor panel 30 and an FPC wire formed in the flexible printed circuit board Fx2. The routing line and the FPC wire that form the dummy line DM4 are connected to each other in the FPC terminal Tx2.

Similarly to the dummy lines DM1 and DM2 according to the present embodiment, each of the dummy lines DM3 and DM4 is connected to the sensor controller 31, but is not connected to any of the plurality of X electrodes 30$x$ and the plurality of Y electrodes 30$y$. The sensor controller 31 employs the dummy lines DM3 and DM4 when deriving a differential between a reception intensity at the X electrode 30$x$4 and a reception intensity at the X electrode 30$x$5. Specifically, the differential between the reception intensity at the X electrode 30$x$4 and the reception intensity at the X electrode 30$x$5 is derived employing a circuit similar to the circuit described above with reference to FIG. 8 or FIG. 9. Noise components are thus eliminated from the differential between the reception intensity at the X electrode 30$x$4 and the reception intensity at the X electrode 30$x$5, and therefore, the position detection device 34 according to the present modification is able to minimize a reduction in accuracy in deriving a position which is caused by arranging the plurality of connection wires CLx to extend in the regions A3 and A4 in a distributed manner.

Note that, while the plurality of connection wires CLy are collectively arranged to extend in the single region in the above-described present modification, it is to be appreciated that the configuration of the plurality of connection wires CLy may be the same as that according to the present embodiment illustrated in FIG. 6. Also note that, while the flexible printed circuit boards Fx1 and Fx2 are completely separate from each other in the above-described present modification, it is to be appreciated that the flexible printed circuit boards Fx1 and Fx2 may be branching portions of a single flexible printed circuit board Fx as in the example illustrated in FIG. 4, for example.

FIG. 11 is a diagram illustrating the configuration of a position detection device 34 according to a third modification of the present embodiment in detail. The position detection device 34 according to the present modification is different from the position detection device 34 according to the second modification in that dummy lines DM5 and DM6 are additionally provided and in processes performed by the sensor controller 31, and is otherwise similar to the position detection device 34 according to the second modification. The following description is provided with a focus placed on differences from the position detection device 34 according to the second modification.

The dummy line DM5 (i.e., a third dummy line) is a wire arranged to extend along the connection wire CLx1 in the region A3, and includes a routing line formed in the sensor panel 30 and an FPC wire formed in the flexible printed circuit board Fx1. The routing line and the FPC wire that form the dummy line DM5 are connected to each other in the FPC terminal Tx1.

The dummy line DM6 (i.e., a fourth dummy line) is a wire arranged to extend along the connection wire CLx8 in the region A4, and includes a routing line formed in the sensor panel 30 and an FPC wire formed in the flexible printed circuit board Fx2. The routing line and the FPC wire that form the dummy line DM6 are connected to each other in the FPC terminal Tx2.

Similarly to the dummy lines DM3 and DM4, each of the dummy lines DM5 and DM6 is connected to the sensor controller 31, but is not connected to any of the plurality of X electrodes 30$x$ and the plurality of Y electrodes 30$y$. The sensor controller 31 employs the dummy line DM5 when deriving a differential between a reception intensity at the X electrode 30$x$1 (i.e., the third sensor electrode), which is positioned at an end of the plurality of X electrodes 30$x$ on the one side, and a reception intensity at the X electrode 30$x$2 (i.e., the fourth sensor electrode), which is adjacent to the X electrode 30$x$1, and employs the dummy line DM6 when deriving a differential between a reception intensity at the X electrode 30$x$8 (i.e., a fifth sensor electrode), which is positioned at an end of the plurality of X electrodes 30$x$ on the opposite side, and a reception intensity at the X electrode 30$x$7 (i.e., a sixth sensor electrode), which is adjacent to the X electrode 30$x$8. This regard will be described specifically below.

FIGS. 12A and 12B are each a diagram illustrating a circuit provided in the sensor controller 31 according to the present modification. FIG. 12A illustrates a circuit for deriving the differential between the reception intensity at the X electrode 30$x$1 and the reception intensity at the X electrode 30$x$2, while FIG. 12B illustrates a circuit for deriving the differential between the reception intensity at the X electrode 30$x$7 and the reception intensity at the X electrode 30$x$8. Circuits for deriving differentials between reception intensities at other sensor electrodes have configurations similar to those according to the present embodiment described above.

First, with reference to FIG. 12A, the sensor controller 31 has a two-input subtraction circuit D3 provided in a stage previous to a subtraction circuit D0 as illustrated in FIG. 7A and so on. An inverting input terminal of the subtraction circuit D3 is connected to the dummy line DM5, a non-inverting input terminal thereof is connected to the connection wire CLx1 (i.e., a third connection wire), and an output terminal thereof is connected to an inverting input terminal of the subtraction circuit D0. The connection wire CLx2 (i.e., a fourth connection wire) is connected to a non-inverting input terminal of the subtraction circuit D0. As a result, a noise component $N_{DM5}$ received at the dummy line DM5 is supplied to the inverting input terminal of the subtraction circuit D3, while a signal component $S_{30x1}$ and a noise component $N_{30x1}$ received at the X electrode 30$x$1 and a noise component $N_{CLx1}$ received at the connection wire CLx1 are supplied to the non-inverting input terminal of the subtraction circuit D3. Accordingly, a signal (i.e., a third differential signal) outputted from the output terminal of the subtraction circuit D3 and supplied to the inverting input terminal of the subtraction circuit D0 corresponds to $S_{30x1}+N_{30x1}+(N_{CLx1}-N_{DM5})$. Meanwhile, a signal component $S_{30x2}$ and a noise component $N_{30x2}$ received at the X electrode 30$x$2 and a noise component $N_{CLx2}$ received at the connection wire CLx2 are supplied to the non-inverting input terminal of the subtraction circuit D0.

Here, in the vicinity of an end portion of each of the sensor panel 30 and the flexible printed circuit boards Fx1 and Fx2, noise that is different from noise that occurs at a middle portion thereof may occur. This case corresponds to a case in which $N_{CLx2}=NC$ and $N_{DM5}=NE$, where NC denotes the noise that occurs at the middle portion and NE denotes the noise that occurs in the vicinity of the end portion. In this case, the noise component $N_{CLx1}$ received at the connection wire CLx1, which is positioned at a boundary between the end and middle portions, amounts to NC+NE.

In the case where such noise occurs, the subtraction circuit D3 performs a function of eliminating the noise NE, and an output signal outputted from the subtraction circuit D3, i.e., a signal inputted to the inverting input terminal of the subtraction circuit D0, corresponds to $S_{30x1}+N_{30x1}+NC$. Meanwhile, a signal inputted to the non-inverting input terminal of the subtraction circuit D0 corresponds to $S_{30x2}+N_{30x2}+NC$. Accordingly, an output signal outputted from the subtraction circuit D0 corresponds to $S_{30x2}+N_{30x2}+NC-(S_{30x1}+N_{30x1}+NC)=S_{30x2}-S_{30x1}$, with the noises NC and NE and the respective external noises received at the X electrodes 30$x$1 and 30$x$2 eliminated therefrom.

Next, with reference to FIG. 12B, the sensor controller 31 has a two-input subtraction circuit D3 provided in a stage previous to a subtraction circuit D0 in this case as well. An inverting input terminal of the subtraction circuit D3 is connected to the dummy line DM6, a non-inverting input terminal thereof is connected to the connection wire CLx8 (i.e., a fifth connection wire), and an output terminal thereof is connected to a non-inverting input terminal of the subtraction circuit D0. The connection wire CLx7 (i.e., a sixth connection wire) is connected to an inverting input terminal of the subtraction circuit D0. As a result, a noise component $N_{DM6}$ received at the dummy line DM6 is supplied to the inverting input terminal of the subtraction circuit D3, while a signal component $S_{30x8}$ and a noise component $N_{30x8}$ received at the X electrode 30$x$8 and a noise component $N_{CLx8}$ received at the connection wire CLx8 are supplied to the non-inverting input terminal of the subtraction circuit D3. Accordingly, a signal (i.e., a fourth differential signal) outputted from the output terminal of the subtraction circuit D3 and supplied to the non-inverting input terminal of the subtraction circuit D0 corresponds to $S_{30x8}+N_{30x8}+(N_{CLx8}-N_{DM6})$. Meanwhile, a signal component $S_{30x7}$ and a noise component $N_{30x7}$ received at the X electrode 30$x$7 and a noise component $N_{CLx7}$ received at the connection wire CLx7 are supplied to the inverting input terminal of the subtraction circuit D0. The above configuration makes it possible to eliminate the noises NC and NE and the respective external noises received at the X electrodes 30$x$7 and 30$x$8 from an output signal outputted from the subtraction circuit D0 as in the case of FIG. 12A.

As described above, even if, in the vicinity of the end portion of each of the sensor panel 30 and the flexible printed circuit boards Fx1 and Fx2, noise that is different from the noise that occurs at the middle portion thereof occurs, the position detection device 34 according to the present modification is able to eliminate such noise from the output signal outputted from the subtraction circuit D0. Therefore, the position detection device 34 according to the present modification is able to minimize a reduction in accuracy in deriving a position which is caused as a result of, in the vicinity of the end portion of each of the sensor panel 30 and the flexible printed circuit boards Fx1 and Fx2, the noise that is different from the noise that occurs at the middle portion thereof occurring.

While preferred embodiments of the present disclosure have been described above, the present disclosure is not limited to the above-described embodiments, and it is to be appreciated that various other embodiments of the present disclosure can be implemented without departing from the gist of the present disclosure.

For example, even in the first embodiment, the sensor controller 31 may be configured to employ the differential method to derive the distribution curve. Also, the position detection device 34 may be provided with both the extension lines as used in the first embodiment or the modifications thereof and the dummy lines as used in the second embodiment or the modifications thereof, and be configured to cause the sensor controller 31 to perform the processes as described above with respect to the second embodiment or the modifications thereof.

Also, in each of the above-described embodiments, each of the routing lines RLx and RLy is arranged to extend in a straight fashion, but some or all of the routing lines RLx and RLy, especially the routing lines RLy in the region A2 illustrated in FIG. 2, may be arranged to extend in a step-like fashion. This could prevent the formation of the extension lines EX1 and EX3 from causing an increase in the area of the region A2.

What is claimed is:

1. A position detection device comprising:
a first sensor electrode that extends in a first direction;
a second sensor electrode that extends in the first direction;
a first connection wire connected to the first sensor electrode, wherein the first connection wire includes a portion that extends in a second direction that is perpendicular to the first direction;
a second connection wire connected to the second sensor electrode, wherein the second connection wire includes a portion that extends in the second direction;
a sensor controller connected to the first connection wire and the second connection wire;
a first extension line electrically connected to the first sensor electrode; and
a second extension line electrically connected to the second sensor electrode,
wherein the first extension line and the second extension line are not electrically connected to the sensor controller,
wherein the first extension line includes a portion that extends in the second direction adjacent to the portion of the second connection wire that extends in the second direction, and
wherein the second extension line includes a portion that extends in the second direction adjacent to the portion of the first connection wire that extends in the second direction.

2. The position detection device according to claim 1, further comprising:
a third sensor electrode;
a fourth sensor electrode;
a third extension line and electrically connected to the third sensor electrode; and
a fourth extension line and electrically connected to the fourth sensor electrode.

3. The position detection device according to claim 2, wherein:
each of the first sensor electrode, the second sensor electrode, the third sensor electrode, and the fourth sensor electrode extends in a substantially rectangular sensor panel along the first direction.

4. The position detection device according to claim 3, wherein:
the first connection wire is connected to a first end of the first sensor electrode in the first direction,
the second connection wire is connected to a second end of the second sensor electrode in the first direction,
a third connection wire is connected to a first end of the third sensor electrode in the first direction,
a fourth connection wire is connected to a second end of the fourth sensor electrode in the first direction,
the first extension line is connected to a second end of the first sensor electrode in the first direction,
the second extension line is connected to a first end of the second sensor electrode in the first direction,
the third extension line is connected to a second end of the third sensor electrode in the first direction, and
the fourth extension line is connected to a first end of the fourth sensor electrode in the first direction.

5. The position detection device according to claim 1, wherein:
the first connection wire extends in a first flexible printed circuit board, and
the second connection wire extends in a second flexible printed circuit board that is different from the first flexible printed circuit board.

6. The position detection device according to claim 5, wherein:
the first extension line is connected to the first connection wire by a first via-hole conductor, and
the second extension line is connected to the second connection wire by a second via-hole conductor.

7. A sensor panel comprising:
a first sensor electrode that extends in a first direction;
a second sensor electrode that extends in the first direction;
a first routing line connected to the first sensor electrode, wherein the first routing line includes a portion that extends in a second direction that is perpendicular to the first direction;
a second routing line connected to the second sensor electrode, wherein the second routing line includes a portion that extends in the second direction;
a first extension line electrically connected to the first sensor electrode; and
a second extension line electrically connected to the second sensor electrode,
wherein the first extension line and the second extension line are not electrically connected to connection terminals that, in operation, are electrically connected to a sensor controller,
wherein the first extension line includes a portion that extends in the second direction adjacent to the portion of the second routing line that extends in the second direction, and
wherein the second extension line includes a portion that extends in the second direction adjacent to the portion of the first routing line that extends in the second direction.

8. The sensor panel according to claim 7, further comprising:
a third sensor electrode;
a fourth sensor electrode;
a third extension line electrically connected to the third sensor electrode; and
a fourth extension line electrically connected to the fourth sensor electrode.

9. The sensor panel according to claim 8, wherein:

each of the first sensor electrode, the second sensor electrode, the third sensor electrode, and the fourth sensor electrode extends in a substantially rectangular sensor panel along the first direction.

10. The sensor panel according to claim 9, wherein:

the first routing line is connected to a first end of the first sensor electrode in the first direction, the second routing line is connected to a second end of the second sensor electrode in the first direction, a third routing line is connected to a first end of the third sensor electrode in the first direction, a fourth routing line is connected to a second end of the fourth sensor electrode in the first direction, the first extension line is connected to a second end of the first sensor electrode in the first direction, the second extension line is connected to a first end of the second sensor electrode in the first direction, the third extension line is connected to a second end of the third sensor electrode in the first direction, and the fourth extension line is connected to a first end of the fourth sensor electrode in the first direction.

11. The sensor panel according to claim 7, wherein:

the first routing line extends in a first flexible printed circuit board, and the second routing line extends in a second flexible printed circuit board that is different from the first flexible printed circuit board.

12. The sensor panel according to claim 11, wherein:

the first extension line is connected to the first routing line by a first via-hole conductor, and the second extension line is connected to the second routing line by a second via-hole conductor.

* * * * *